United States Patent
Rana et al.

(10) Patent No.: US 9,659,933 B2
(45) Date of Patent: May 23, 2017

(54) BODY BIAS MULTIPLEXER FOR STRESS-FREE TRANSMISSION OF POSITIVE AND NEGATIVE SUPPLIES

(71) Applicant: STMicroelectronics International N.V., Schiphol (NL)

(72) Inventors: Vikas Rana, Noida (IN); Amit Chhabra, Delhi (IN)

(73) Assignee: STMICROELECTRONICS INTERNATIONAL N.V., Schiphol (NL)

( * ) Notice: Subject to any disclaimer, the term of this patent is extended or adjusted under 35 U.S.C. 154(b) by 46 days.

(21) Appl. No.: 14/697,461

(22) Filed: Apr. 27, 2015

(65) Prior Publication Data
US 2016/0315611 A1    Oct. 27, 2016

(51) Int. Cl.
| | | |
|---|---|---|
| *H03K 17/693* | (2006.01) | |
| *H01L 27/092* | (2006.01) | |
| *H01L 27/12* | (2006.01) | |
| *H03K 17/00* | (2006.01) | |

(52) U.S. Cl.
CPC ........ *H01L 27/092* (2013.01); *H01L 27/1203* (2013.01); *H03K 17/693* (2013.01); *H03K 17/005* (2013.01); *H03K 2217/0018* (2013.01)

(58) Field of Classification Search
CPC .............................. H03K 2217/0018
See application file for complete search history.

(56) References Cited

U.S. PATENT DOCUMENTS

| | | | | |
|---|---|---|---|---|
| 5,023,688 A | * | 6/1991 | Ando | H01L 27/092 257/350 |
| 5,103,277 A | * | 4/1992 | Caviglia | H01L 27/1203 257/348 |
| 5,646,900 A | * | 7/1997 | Tsukude | G11C 7/065 365/189.09 |
| 6,333,571 B1 | * | 12/2001 | Teraoka | H01L 27/092 257/E27.062 |
| 6,774,705 B2 | * | 8/2004 | Miyazaki | H03K 19/00384 327/534 |
| 6,867,637 B2 | * | 3/2005 | Miyazaki | G05F 3/205 327/306 |
| 7,453,311 B1 | * | 11/2008 | Hart | G05F 3/242 327/534 |
| 7,570,509 B2 | * | 8/2009 | Takizawa | H01L 21/84 257/348 |

(Continued)

OTHER PUBLICATIONS

Di et al., "Power Switch Characterization for Fine-Grained Dynamic Voltage Scaling," IEEE International Conference on Computer Design, Oct. 12-15, 2008, Lake Tahoe, CA, pp. 605-611.

(Continued)

*Primary Examiner* — Thomas J Hiltunen
(74) *Attorney, Agent, or Firm* — Seed IP Law Group LLP

(57) ABSTRACT

An integrated circuit die includes a plurality of transistors formed in a semiconductor substrate, the body regions of the transistors on a doped well region of the semiconductor substrate. A body bias voltage generator generates a positive body bias voltage, and a negative body bias voltage in the ground body bias voltage. A multiplexer selectively outputs one of the positive, negative, or ground body bias voltage to the doped well region of the semiconductor substrate based on the temperature of the semiconductor substrate.

20 Claims, 11 Drawing Sheets

(56) References Cited

U.S. PATENT DOCUMENTS

| | | | | |
|---|---|---|---|---|
| 7,612,604 | B2* | 11/2009 | Miyazaki | H01L 27/0928 327/534 |
| 7,821,066 | B2* | 10/2010 | Lebby | H01L 29/78603 257/347 |
| 7,825,693 | B1* | 11/2010 | Katz | H03K 5/1565 326/27 |
| 8,081,502 | B1* | 12/2011 | Rahim | G11C 11/412 365/154 |
| 8,415,743 | B2* | 4/2013 | Cai | H01L 27/1203 257/348 |
| 8,416,009 | B2* | 4/2013 | Cranford, Jr. | H01L 27/1203 257/347 |
| 8,461,899 | B2 | 6/2013 | Rana | |
| 8,575,697 | B2* | 11/2013 | Mazure | G11C 11/412 257/347 |
| 8,988,135 | B2* | 3/2015 | Kim | G05F 3/205 327/513 |
| 9,231,580 | B2* | 1/2016 | Ku | H03K 17/56 |
| 9,298,205 | B2* | 3/2016 | Bianchi | G01K 7/01 |
| 2012/0327725 | A1* | 12/2012 | Clark | G11C 11/412 365/189.011 |
| 2013/0057334 | A1* | 3/2013 | Hasbani | H03K 19/0013 327/530 |
| 2014/0032949 | A1* | 1/2014 | Kim | G06F 1/3206 713/322 |
| 2015/0049536 | A1* | 2/2015 | Oh | G11C 13/003 365/148 |

OTHER PUBLICATIONS

Flatresse et al., "24.3 Ultra-Wide Body-Bias Range LDPC Decoder in 28nm UTBB FDSOI Technology," IEEE International Solid-State Circuits Conference, 2013, 3 pages.

Galy et al., "New modular bi-directional power-switch and self ESD protected in 28nm UTBB FDSOI advanced CMOS technology," IEEE International Conference on IC Design & Technology, May 28-30, 2014, Austin, TX, 4 pages.

Henzler et al., "16.6 Sleep Transistor Circuits for Fine-Grained Power Switch-Off with Short Power-Down Times," IEEE International Solid-State Circuits Conference, 2005, pp. 302-304.

Jacquet et al., "2.6GHz ultra-wide voltage range energy efficient dual A9 in 28nm UTBB FD-SOI," Symposium on VLSI Circuits Digest of Technical Papers, 2013, 2 pages.

Jacquet et al., "A 3 GHz Dual Core Processor ARM Cortex™-A9 in 28 nm UTBB FD-SOI CMOS With Ultra-Wide Voltage Range and Energy Efficiency Optimization," *IEEE Journal of Solid-State Circuits* 49(4), Apr. 2014, 15 pages.

Kumar et al., "Temperature-Adaptive Body-Bias and Supply Voltage Scaling for Enhanced Energy Efficiency in Nano-CMOS Circuits," $50^{th}$ Midwest Symposium on Circuits and Systems, Aug. 5-8, 2007, Montreal, Quebec, pp. 702-705.

Le Coz et al., "DTMOS Power Switch in 28 nm UTBB FD-SOI Technology," IEEE SOI-3D-Subthreshold Microelectronics Technology Unified Conference (S3S), Oct. 7-10, 2013, Monterey, CA, 2 pages.

Le Coz et al., "Power Switch Optimization and Sizing in 65nm PD-SOI Considering Supply Voltage Noise," IEEE International Conference on IC Design and Technology, Jun. 2-4, 2010, Grenoble, pp. 186-189.

Moradi et al., "New SRAM Design Using Body Bias Technique for Ultra Low Power Applications," $11^{th}$ International Symposium on Quality Electronic Design, Mar. 22-24, 2010, San Jose, CA, pp. 468-471.

Mostafa et al., "NBTI and Process Variations Compensation Circuits Using Adaptive Body Bias," *IEEE Transactions on Semiconductor Manufacturing* 25(3):460-467, Aug. 2012.

Oh et al., "Thermal-aware Body Bias Modulation for High Performance Mobile Core," International SoC Design Conference, Nov. 4-7, 2012, Jeju Island, pp. 147-150.

Ono et al., "Temperature Referenced Supply Voltage and Forward-body-bias Control (TSFC) Architecture for Minimum Power Consumption," Proceeding of the $30^{th}$ European Solid-State Circuits Conference, Sep. 21-23, 2004, pp. 391-394.

Planes et al., "28nm FDSOI Technology Platform for High-Speed Low-Voltage Digital Applications," Symposium on VLSI Technology Digest of Technical Papers, 2012, pp. 133-134.

Planes et al., "Process Architecture for Spatial and Temporal Variability Improvement of SRAM Circuits at the 45nm node," International Conference on Solid State Device and Materials, 2008, 2 pages.

Ranica et al., "FDSOI Process/Design full solutions for Ultra Low Leakage, High Speed and Low Voltage SRAMs," Symposium on VLSI Technology Digest of Technical Papers, 2013, 2 pages.

Sathanur et al., "Improving Efficiency of Power Gated Circuits through Concurrent Optimization of Power Switch Size and Forward Body Biasing," IEEE International Conference on IC Design and Technology, Jun. 2-4, 2010, Grenoble, pp. 178-181.

Thomas et al., "6T SRAM Design for Wide Voltage Range in 28nm FDSOI," IEEE International SOI Conference, Oct. 1-4, 2012, Napa, CA, 2 pages.

Yamaoka et al., "Operating-margin-improved SRAM with Column-at-a-time Body-bias Control Technique," $33^{rd}$ European Solid State Circuits Conference, Sep. 11-13, 2007, Munich, pp. 396-399.

\* cited by examiner

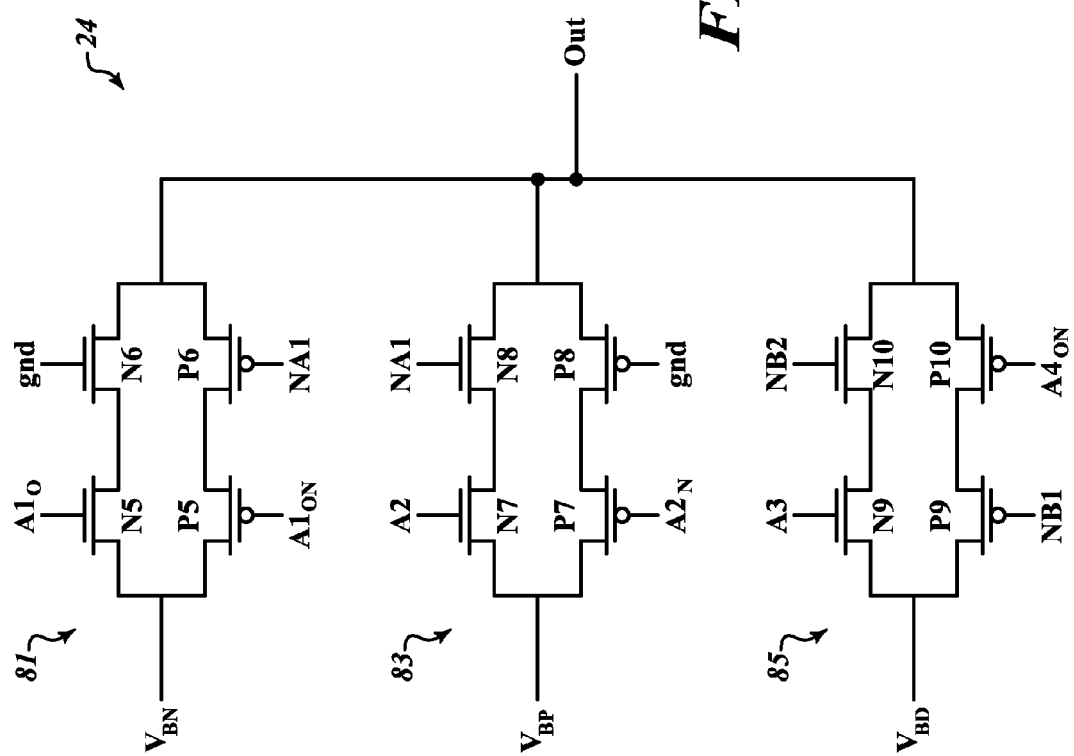

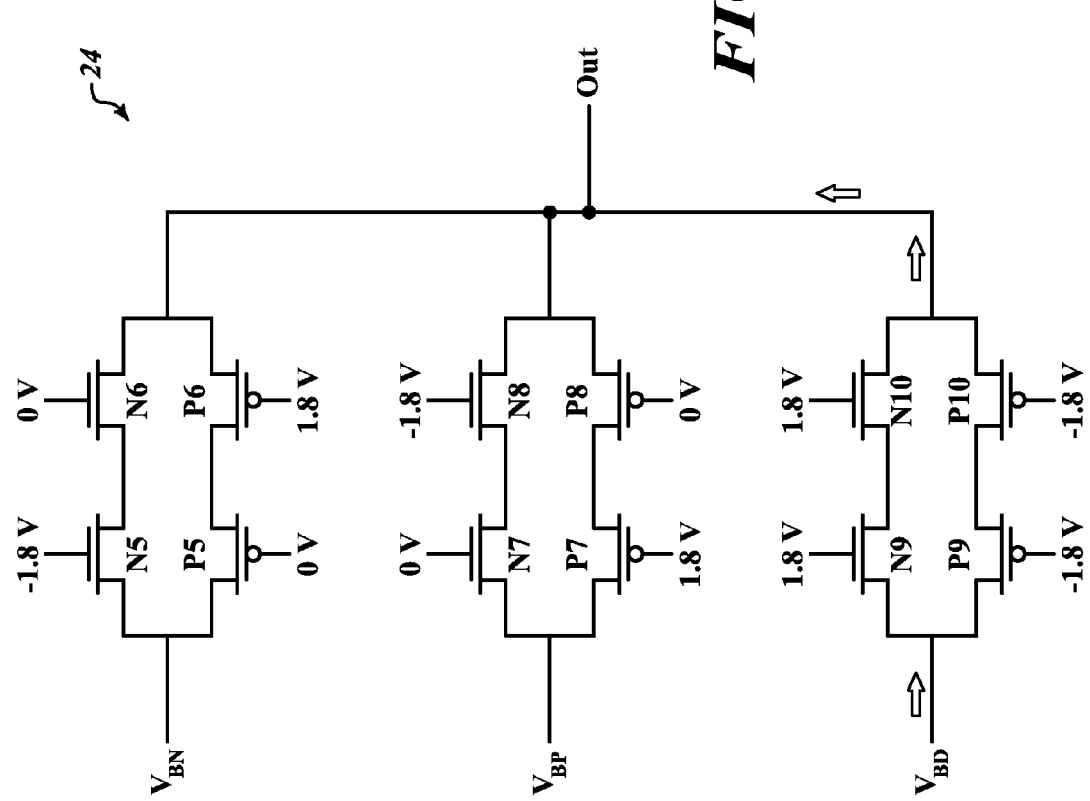

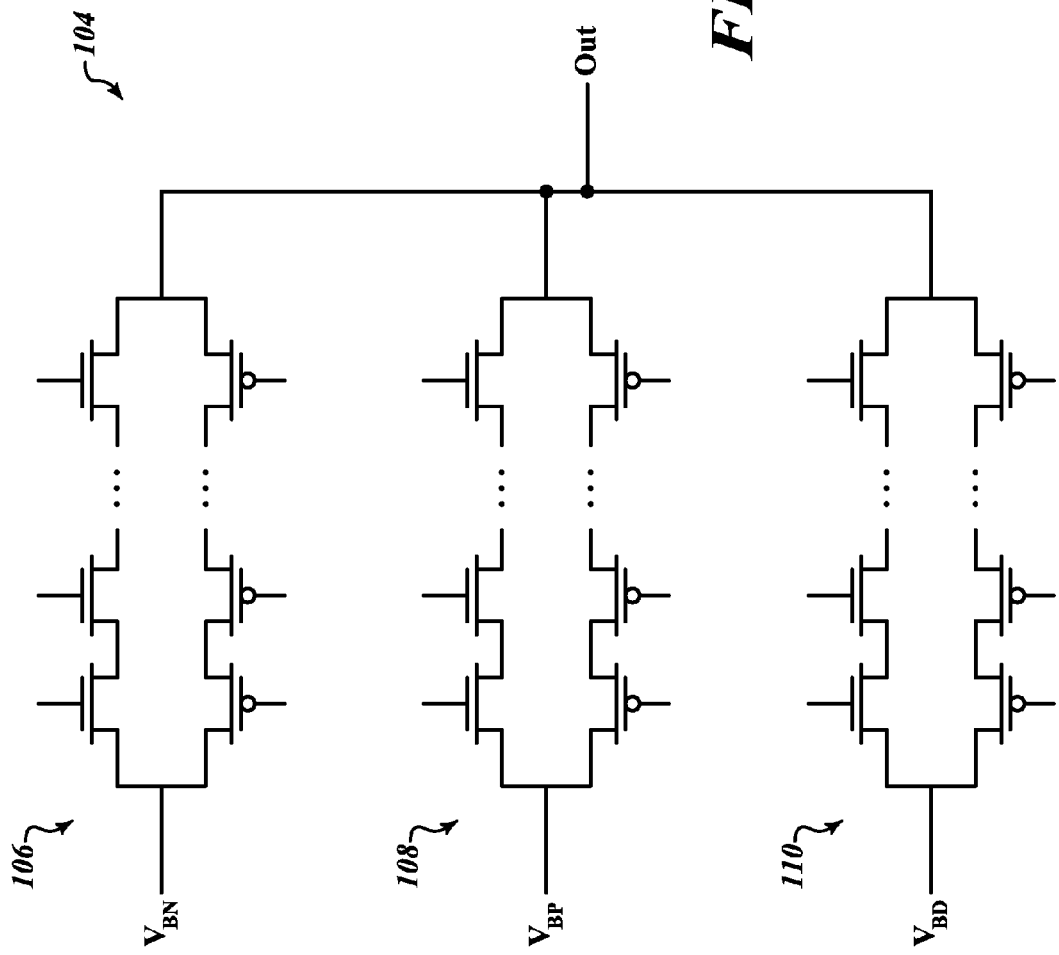

BODY BIAS MULTIPLEXER FOR STRESS-FREE TRANSMISSION OF POSITIVE AND NEGATIVE SUPPLIES

BACKGROUND

Technical Field

The present disclosure relates to the field of integrated circuit dies and, more particularly, to the application of bias voltages to the body regions of transistors in an integrated circuit die.

Description of the Related Art

Many types of electronic devices include integrated circuit dies. The integrated circuit dies can include millions or even billions of transistors. As the number of transistors increases, so too can the power consumed by the integrated circuit die. Handheld or other portable electronic devices typically are powered by one or more batteries. The higher the rate of power consumption, the more quickly the batteries become depleted. Thus, many schemes have been devised to reduce the rate of power consumption.

One way to reduce power consumption in an electronic device is to lower the operating voltage. In devices that include an SRAM array, the minimum operating voltage of the SRAM array can become a limiting factor in reducing the operating voltage. This is because at low voltages, the temperature of the semiconductor substrate can affect the reliability of both read and write operations of the SRAM. In particular, SRAM bit cells can have conflicting requirements for read and write operations with regard to temperature and operating voltage.

Each SRAM bit cell typically includes both NMOS and PMOS transistors. The threshold voltage of both NMOS and PMOS transistors increases with decreasing temperature. Higher temperatures can lead to an increase in failures during read operations, i.e., destructive reads, or flipping of stored data during read operations from an SRAM bit cell. Conversely, lower temperatures can lead to an increase in failures during write operations. This effect of temperature is generally predominant at low voltage operation of the SRAM bit cell.

BRIEF SUMMARY

One embodiment is an integrated circuit die that compensates for the effects of temperature variation on the operation of an SRAM by selectively applying different body bias voltages to the body regions of the transistors based on the temperatures of the body regions. In this way, an appropriate body bias voltage can be selectively applied to the body regions of the transistors based on the temperature of the body regions. This can improve the reliability of the SRAM by reducing errors during read and write operations of the SRAM.

In one embodiment, the integrated circuit die includes a semiconductor substrate, a doped well region positioned in the semiconductor substrate, and an SRAM array including a plurality of transistors having body regions positioned in the doped well region. Further, the doped well region can be common for the NMOS and PMOS devices of the SRAM array in fully depleted silicon on insulator (FDSOI) technology including planar and FINFET devices. The integrated circuit die further includes a temperature sensor that measures the temperature of the doped well region and a body bias generator that generates a positive body bias voltage, a ground body bias voltage, and a negative body bias voltage. A body bias multiplexer receives the positive, negative, and ground bias voltages and selectively applies one of them to the doped well region based on the temperature of the doped well region.

In one embodiment the multiplexer includes a plurality of control transistors that receive control signals to selectively pass the positive, negative, or ground body bias voltages. The control transistors are configured such that the positive, negative, and ground body bias voltages can be selectively output from the multiplexer without surpassing the stress limits of the control transistors of the multiplexer. This can be accomplished by providing to the control transistors control signals having a positive, negative polarity, or ground polarity depending on which body bias voltage is to be output from the multiplexer.

The principles of selectively applying positive, negative, or ground body bias voltages are also extended to applications other than SRAMs.

BRIEF DESCRIPTION OF THE SEVERAL VIEWS OF THE DRAWINGS

FIG. 3A is a schematic diagram of a body bias multiplexer receiving various control signals, according to one embodiment.

FIGS. 3B-3D represent the body bias multiplexer of FIG. 3A under various operating conditions, according to one embodiment.

FIG. 7 is a schematic diagram of a body bias multiplexer, according to one embodiment.

DETAILED DESCRIPTION

Figure 1:
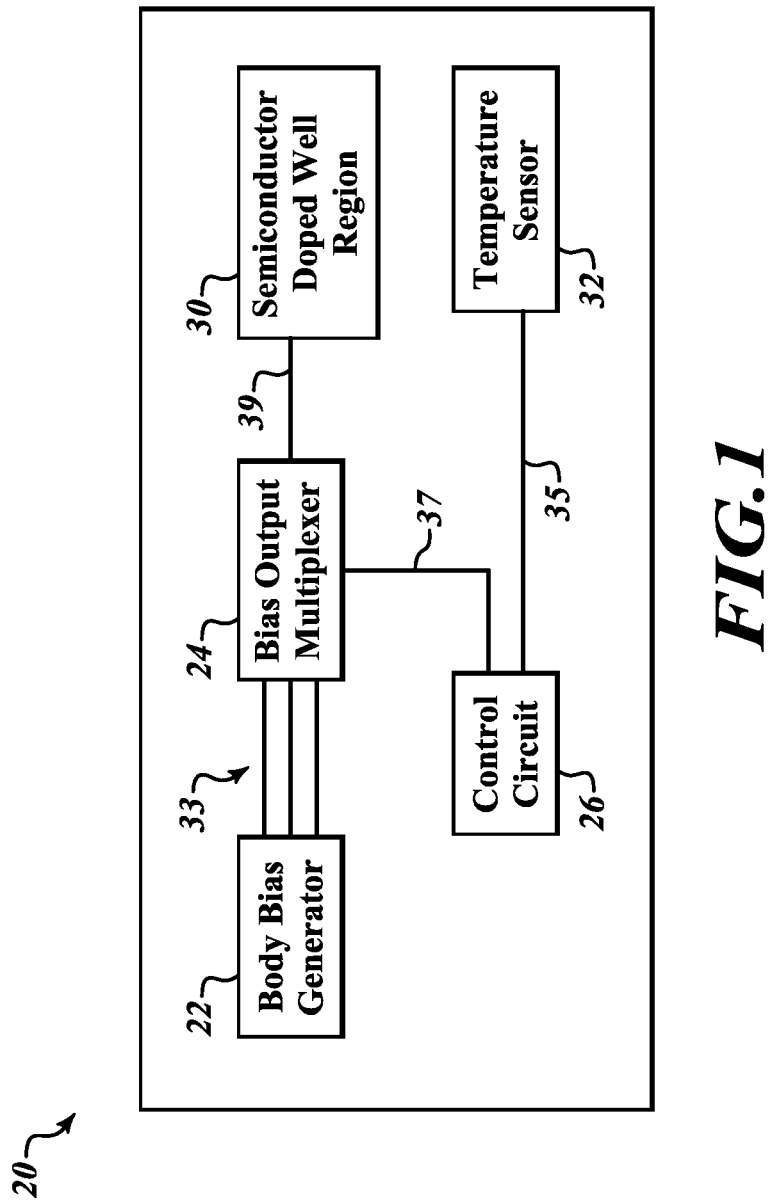
FIG. 1 is a block diagram of an integrated circuit die, according to one embodiment.

FIG. 1 is a block diagram of an integrated circuit die 20 according to one embodiment. The integrated circuit die 20 includes a body bias generator 22 coupled to a bias output multiplexer 24 via lines 33. A control circuit 26 is coupled to the bias output multiplexer 24 via line 37. A semiconductor doped well region 30 is coupled to the bias output multiplexer 24 via line 39. A temperature sensor 32 outputs a temperature signal on line 35 to the control circuit 26.

In one embodiment, the body bias generator 22 generates three separate body bias voltages to be selectively applied to the body regions of the transistors in the doped well region 30. The body bias generator 22 generates a negative body bias voltage $V_{BN}$, a positive body bias voltage $V_{BP}$, and a default voltage $V_{BD}$. According to an embodiment, the body bias generator 22 receives the integrated circuit high supply voltage $V_H$ (1.8 V)-and ground. The body bias generator 22 generates $V_{BN}$, $V_{BP}$, and $V_{BD}$ from the supply voltages $V_{DD}$ and ground. In an alternate arrangement, the default voltage $V_{BD}$ can also be a separate supply to the integrated circuit die 20.

In one embodiment, the supply voltage $V_H$ is about 1.8 V and ground is 0 V. The value of $V_{BP}$ is, for example, 1.1 V.

$V_{BN}$ is, for example, −1.1 V. The default voltage $V_{BD}$ is, for example, ground. However, $V_{BD}$ can also have any value ranging between $V_{BN}$ and $V_{BP}$, particularly during testing phases of the integrated circuit die 20. Though particular values of $V_{BN}$, $V_{BP}$, and $V_{BD}$ have been given by way of example, other values of $V_{BN}$, $V_{BP}$, and $V_{BD}$ can also be used, as will be understood by those of skill in the art in light of the present disclosure.

The bias output multiplexer 24 receives $V_{BN}$, $V_{BP}$, and $V_{BD}$ from the body bias generator 22. The bias output multiplexer 24 outputs one of $V_{BN}$, $V_{BP}$, and $V_{BD}$ to the semiconductor doped well region 30. In particular, the bias output multiplexer 24 outputs one of the received body bias voltages $V_{BN}$, $V_{BP}$, and $V_{BD}$ based on the one or more control signals received from the control circuit 26.

In one embodiment, the temperature sensor 32 senses the temperature of the semiconductor doped well region 30 and outputs a temperature signal to the control circuit 26. The temperature signal is indicative of the temperature of the doped well region 30. The temperature sensor 32 can include one or more BJT-based (bipolar junction transistor) temperature sensors that detect the temperature of the doped well region 30 directly or a portion of the semiconductor adjacent to the doped well region 30. Alternatively, the temperature sensor 32 can include any other suitable temperature sensing scheme for detecting directly or indirectly the temperature of the semiconductor doped well region 30.

The control circuit 26 receives the temperature signal from the temperature sensor 32 and outputs the one or more control signals to the bias output multiplexer 24 based on the temperature signal. Thus, the control circuit 26 causes the body bias multiplexer 24 to output one of $V_{BN}$, $V_{BP}$, and $V_{BD}$, based at least in part on the temperature of the doped well region 30.

In one example, the control circuit 26 causes the multiplexer 24 to output the positive body bias voltage $V_{BP}$ when the temperature signal indicates that the temperature of the doped well region 30 is below 50° C. The control circuit 26 causes the multiplexer 24 to output the default body bias voltage $V_{BD}$ when the temperature signal indicates that the temperature of the doped well region 30 is between 50° C. and 125° C. The control circuit 26 causes the multiplexer 24 to output the positive body bias voltage $V_{BN}$ when the temperature signal indicates that the temperature of the doped well region 30 is above 125° C. Those of skill in the art will understand, in light of the present disclosure, that other values for the threshold temperatures can be used.

According to one embodiment, the integrated circuit die 20 can include an SRAM array made up of a plurality of transistors. Body regions of at least some of the transistors of the SRAM array are located in the semiconductor doped well region 30. The threshold voltages of the transistors depend in part on the bias voltage applied to the body regions of the transistors. The threshold voltages of the transistors also depend in part on the temperature of the body region.

In the example of an SRAM array, high junction temperatures can lead to an increased rate of failure of read operations. Additionally, low junction temperatures can lead to an increased rate of failure of write operations. In order to ameliorate these problems, the bias output multiplexer 24, in conjunction with the control circuit 26, applies the negative body bias voltage $V_{BN}$ to the doped well region 30 when the temperature of the doped well region 30 is above a high threshold temperature. Likewise, the bias output multiplexer 24 applies the positive body bias voltage $V_{BP}$ to the doped well region 30 when the temperature of the doped well region 30 is below a low threshold temperature. The bias output multiplexer 24 outputs the default voltage $V_{BD}$ to the doped well region 30 when the temperature of the doped well region is between the high and low threshold temperatures. The selective application of $V_{BP}$, $V_{BN}$, and $V_{BD}$ can lead to improved functionality of the SRAM array.

In one example, the control circuit 26 causes the multiplexer 24 to output the positive body bias voltage $V_{BP}$ when the temperature signal indicates that the temperature of the doped well region 30 is below 50° C. The control circuit 26 causes the multiplexer 24 to output the default body bias voltage $V_{BD}$ when the temperature signal indicates that the temperature of the doped well region 30 is between 50° C. and 125° C. The control circuit 26 causes the multiplexer 24 to output the positive body bias voltage $V_{BN}$ when the temperature signal indicates that the temperature of the doped well region 30 is above 125° C. Those of skill in the art will understand, in light of the present disclosure, that other values of threshold temperatures can be used.

The principles of the present disclosure can be extended to many other applications other than transistors of an SRAM array, as will be apparent to those of skill in the art in light of the present disclosure. All such other applications fall within the scope of the present disclosure.

Figure 2A:
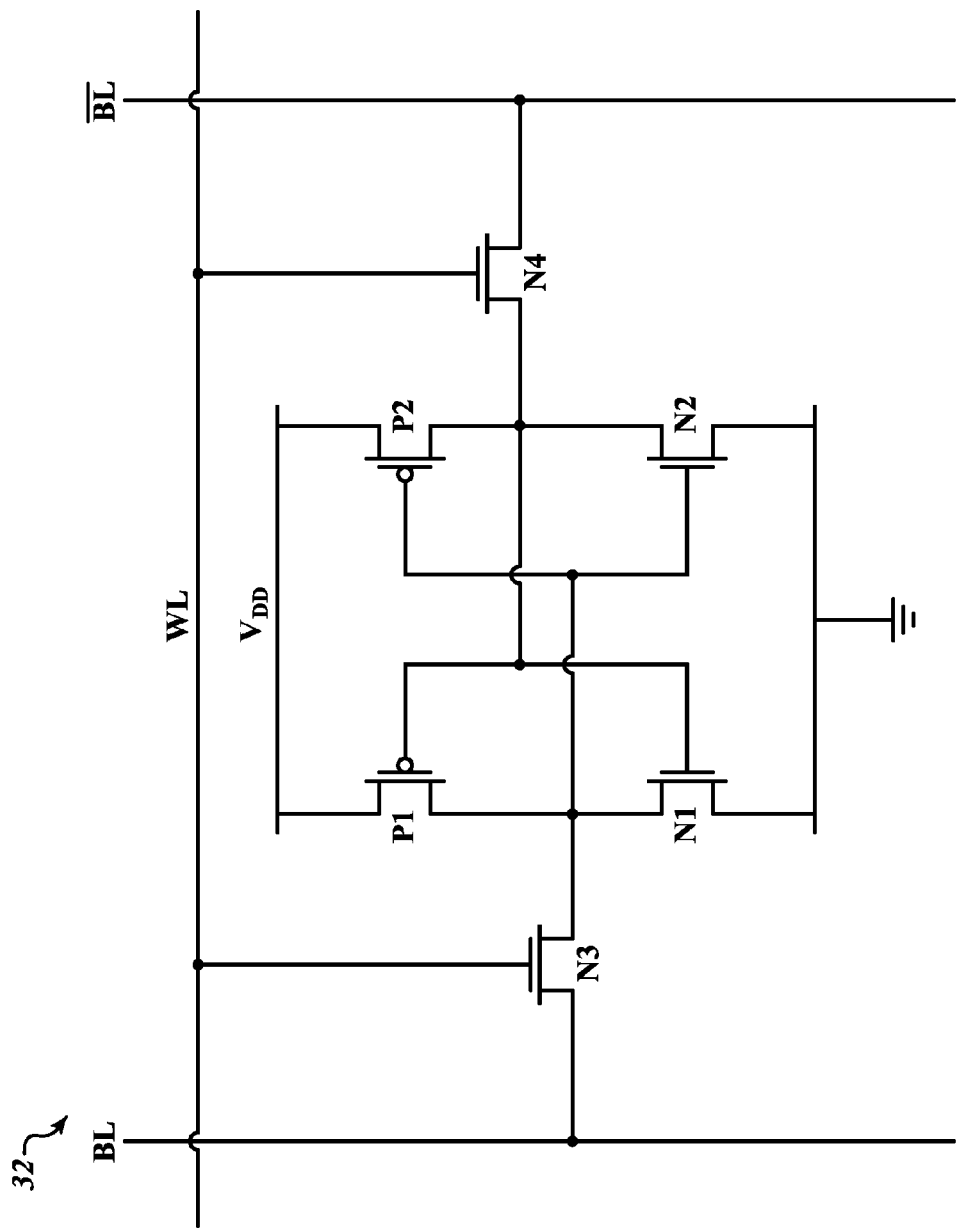
FIG. 2A is a schematic diagram of an SRAM bit cell, according to one embodiment.
Figure 2B:
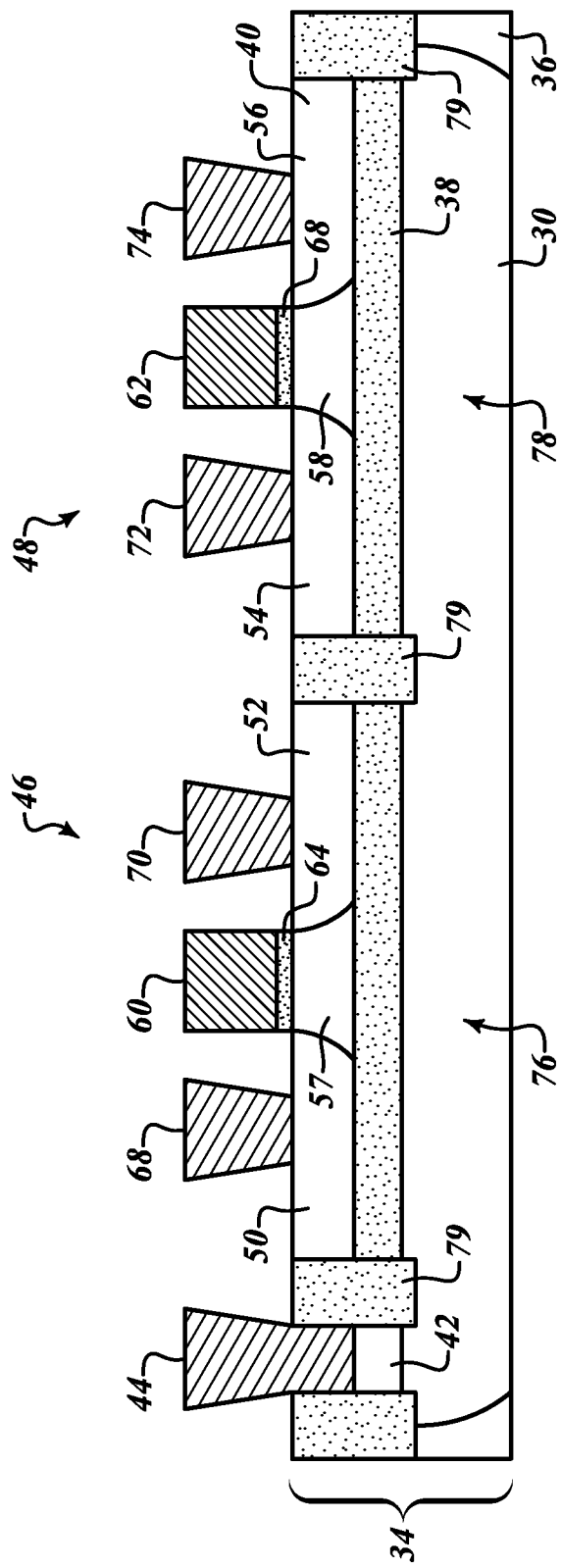
FIG. 2B is a cross section of an integrated circuit die including a semiconductor substrate and transistors, according to one embodiment.

FIG. 2A is a schematic diagram of an SRAM bit cell 33 of an SRAM array implemented in an integrated circuit die 20. Though not shown in FIG. 2A, the integrated circuit die 20 includes a body bias multiplexer 24 as described with reference to FIG. 1 and a fully depleted silicon on insulator (FDSOI) substrate. FIG. 2B is a cross-section of the integrated circuit die illustrating the doped well region 30 in the FDSOI substrate. FIGS. 2A and 2B illustrate an example of one application of principles of the present disclosure.

The SRAM bit cell 33 includes two PMOS transistors, P1, P2, and four NMOS transistors, N1-N4. The transistors P1, N1, form a first inverter. The transistors N2, P2 form a second inverter. The first and second inverters are cross-coupled together such that the output of each inverter is coupled to the input of the other inverter. The transistors N3, N4 are access transistors having their gates coupled to the word line WL. The access transistors couple the bit lines BL to the respective outputs of the inverters. The source terminals of the PMOS transistors P1, P2 are coupled to the supply voltage $V_{DD}$. The source terminals of the transistors N1, N2 are coupled to ground.

During a read operation of the bit cell 33, the bit lines BL are precharged to an intermediate voltage level between $V_{DD}$ and ground. $V_{DD}$ is then applied to the word line WL, thereby enabling the access transistors N3, N4 and coupling the bit lines BL to the respective outputs of the inverters. A small voltage difference will develop between the bit lines BL. This voltage difference is magnified by a sense amplifier (not shown), thereby enabling read circuitry to reliably recognize the difference between the voltages on the bit lines, and thus read the data stored in the SRAM bit cell 33.

During a write operation of the bit cell 33, the bit line BL is brought high while the other bit line BL is brought low, depending upon the data to be written to the SRAM bit cell 33. The word line WL is then brought high, thereby coupling the inputs of the inverters of the bit cell 33 to a respective bit line BL, thereby forcing the cross-coupled inverters into a stable state in which the output of one of the inverters is high while the input of the other inverter is low.

As described previously, in a conventional SRAM array high and low temperatures can adversely affect the reliability of read and write operations, particularly at low operating voltage. However, in an SRAM implemented in conjunction with an FDSOI substrate and with the body bias generator 22 and the bias output multiplexer 24, reliability of read and write operations can be enhanced at high and low temperatures with respect to conventional SRAM arrays.

FIG. 2B is a cross section of the integrated circuit die 20 including an FDSOI semiconductor substrate 34. The FDSOI substrate 34 includes a first layer of semiconductor material 36, a buried oxide layer (BOX) 38 directly on top of the first layer of semiconductor material 36, and a second layer of semiconductor material 40 directly on top of the BOX layer 38. The doped well region 30, for example lightly doped with P-type donor atoms, is formed in the first layer of semiconductor material 36. A highly doped body contact 42. A body contact plug 44 is coupled to the highly doped body contact region 42, by which the body bias voltage can be applied to the doped well region 30. An NMOS transistor 46, for example one of the NMOS transistors N1-N4 of the SRAM bit cell is formed in conjunction with the FDSOI semiconductor substrate 34. A PMOS transistor 48, for example one of the PMOS transistors P1, P2 of the SRAM bit cell 33, is formed in conjunction with the FDSOI semiconductor substrate 34. N-type source and drain regions 50, 52 of the NMOS transistor 46 are formed in the second layer of semiconductor material 40. P-type source and drain regions 54, 56 of the PMOS transistor 48 are formed in the second layer of semiconductor material 40. A channel region 57 of the NMOS transistor 46 is positioned between the source and drain regions 50, 52 in the second layer of semiconductor material 40. A channel region 58 of the PMOS transistor 48 is positioned between the source and drain regions 54, 56 in the second layer of semiconductor material 40. A gate dielectric 64 of the NMOS transistor 46 is positioned over the channel region 57. A gate electrode 60 of the NMOS transistor 46 is positioned on the gate dielectric 64. A gate dielectric 66 of the PMOS transistor 48 is positioned on the channel region 48. A gate electrode 62 of the PMOS transistor is positioned on the gate dielectric 66. Source and drain contact plugs 68, 70 are positioned on the source and drain regions 50, 52. Source and drain contact plugs 72, 74 are positioned on the source and drain regions 54, 56 of the PMOS transistor 48. The body regions 76, 78 of the transistors 46, 48 are positioned in the first layer of semiconductor material 36, and more particularly within the doped well region 30. Trench isolation regions 79, for example of silicon dioxide, are positioned in the FDSOI substrate 34.

In one embodiment, the first layer of semiconductor material 36 is monocrystalline silicon between 10 and 30 nm thick. The BOX layer 38 is silicon dioxide between 10 and 25 nm thick. The second layer of semiconductor material 40 is monocrystalline silicon between 5 and 8 nm thick. Alternatively, other semiconductor materials and dielectric materials can be used for the first and second layers of semiconductor material 36, 38 and the BOX layer 40.

Because the second layer of semiconductor material 40 is very thin, the entire thickness of the second layer of semiconductor material 40 in the channel regions 54 and 58 becomes fully depleted when the transistors 46, 48 are enabled. Thus, the body regions 76, 78 of the transistors 46, 48 are positioned in the doped well region 30. In one embodiment, the doped well region 30 is lightly doped with P-type dopants.

The body bias voltage can be applied to the doped well region 30 by applying a voltage to the body contact plug 44. Because the body contact region 42 is highly doped, the body bias voltage is transferred from the body contact plug 44 to the doped well region 30.

In one embodiment, the negative body bias voltage $V_{BN}$, the positive body bias voltage $V_{BP}$, and the default body bias voltage $V_{BD}$ are selectively applied to the doped well region 30 by the body bias multiplexer 24 based in part on the temperature of the semiconductor substrate 34. The threshold voltages of the transistors 46, 48 is based, in part, on the voltage applied to the doped well region 30.

FIG. 3A is a schematic diagram of the body bias multiplexer 24, according to one embodiment. The body bias multiplexer 24 includes three body bias inputs. The first body bias input receives the negative body bias voltage $V_{BN}$, for example −1.1 V. The second body bias input receives the positive body bias voltage $V_{BP}$, for example 1.1 V. The third body bias input receives the default body bias voltage $V_{BD}$, for example ground. The body bias multiplexer 24 also includes an output Out, by which the multiplexer 24 selectively outputs one of the three body bias voltages. A first circuit branch 81 including two NMOS transistors N5, N6 and two PMOS transistors P5, P6 is coupled between the first body bias input and the output OUT. In particular, the two NMOS transistors N5, N6 are connected in series between the first input and the output Out. The two PMOS transistors P5, P6 are also coupled in series between the first input and the output Out. The two PMOS transistors P5, P6 connected in parallel to the two NMOS transistors N5, N6. The transistors N5, N6, P5, P6 receive on their gate terminals respective control signals $A1_O$, gnd, $A1_{ON}$, and NA1. A second circuit branch 83 including two NMOS transistors N7, N8 and two PMOS transistors P7, P8 is coupled between the second body bias input and the output Out. In particular, the two NMOS transistors N7, N8 are connected in series between the second input and the output Out. The two PMOS transistors P7, P8 are also coupled in series between the second input and the output Out. The two PMOS transistors P7, P8 are connected in parallel with the two NMOS transistors N7, N8. The transistors N7, N8, P7, P8 receive on their gate terminals respective control signals A2, NA1, $A2_N$, and gnd. A third circuit branch 85 including two NMOS transistors N9, N10 and two PMOS transistors P9, P10 is coupled between the third body bias input and the output Out. In particular, the two NMOS transistors N9, N10 are connected in series between the third input and the output Out. The two PMOS transistors P9, P10 are also coupled in series between the third input and the output Out. The two PMOS transistors P9, P10 are connected in parallel to the two NMOS transistors N9, N10. The transistors N9, N10, P9, P10 receive on their gate terminals respective control signals A3, NB2, NB1, and $A4_{ON}$. The values of the control signals will be discussed in more detail below and with reference to FIGS. 4-7.

A consideration in designing a multiplexer that can pass a negative voltage, a positive voltage, and ground is the stress that can be placed on the control transistors within the multiplexer. This is because a transistor typically can only withstand some maximum voltage applied between any two of its terminals. Power transistors implemented in an integrated circuit die at the 28 nm technology node may, in some cases, only be able to withstand a voltage of 1.8 V between any of its terminals. In a situation in which −1.1 V, 0 V, and 1.1 V are all present in the multiplexer, it is possible that a drain terminal of a transistor within the multiplexer could receive −1.1 V while the source terminal of the transistor could receive 1.1 V. Thus, a difference of 2.2 V would be placed between the source and drain terminals of the transistor. This is greater than the 1.8 V maximum and can lead to the destruction of the transistor. Furthermore, it is common for the control terminals of the power transistors within a multiplexer to receive a stepped up voltage of 1.8 V. In a case in which a power transistor receives 1.8 V at its gate terminal and the −1.1 V at source terminal, a voltage difference of 2.9 V would be present between the gate and the source terminals of the transistor, further increasing the risk of destruction of the transistor.

In accordance with these factors, each circuit path of the multiplexer 24 includes a double pass structure including two series-connected NMOS transistors and two series-connected PMOS transistors. Furthermore, some of the NMOS and PMOS transistors of the body bias multiplexer 24 can selectively receive on their respective gate terminals one of three voltages, a positive voltage, a negative voltage, and a ground voltage. This triple bias scheme inhibits a voltage of greater than 1.8 V from appearing between the terminals of any of the transistors, while still allowing both positive and negative voltages to be selectively output from the body bias multiplexer 24. In one embodiment, the power transistors N5-N10, P5-P10 receive control voltages of 1.8 V, 0 V, or −1.8 V.

Figure 3B:
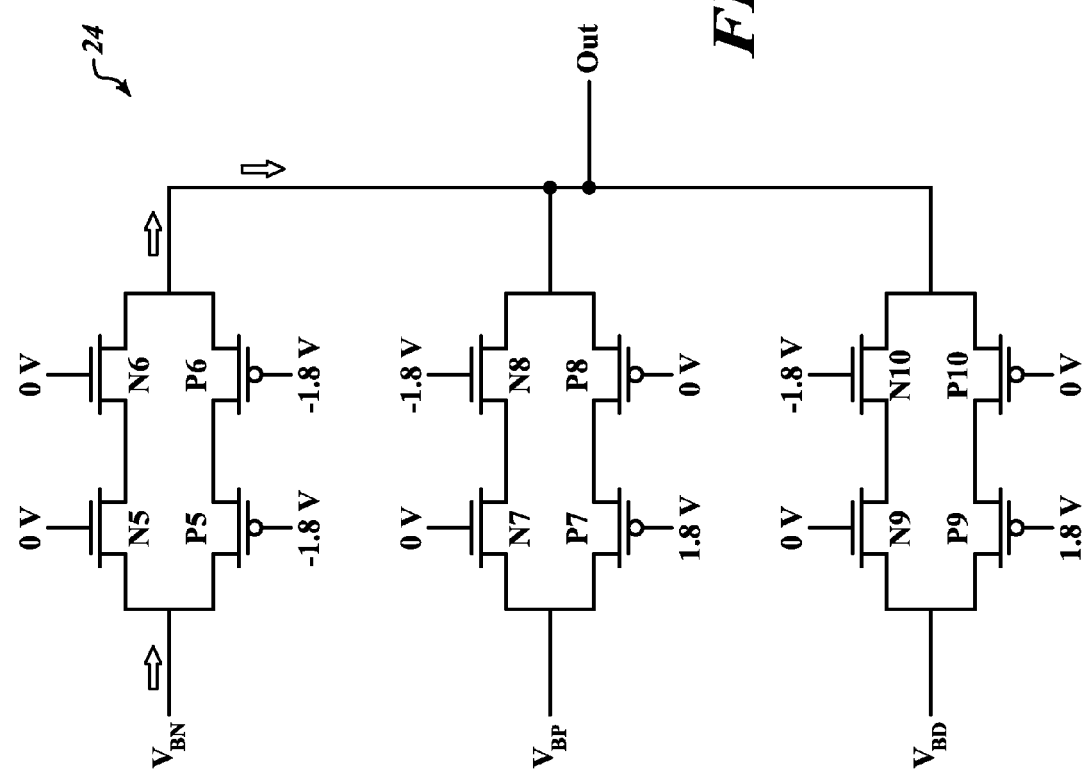

FIG. 3B illustrates an example in which the multiplexer 24 outputs the negative body bias voltage $V_{BN}$, the transistors N5, N6, P5, P6 of the first circuit branch 81 are all conductive, while the transistors N7-N10 and P7-P10 of the second and third circuit paths 83, 85 are non-conductive. In particular, the transistors N5 and N6 receive 0 volts on their gate terminals, i.e., the value of A10 and gnd are 0 V. Because the drain terminal of N5 receives $V_{BN}$ (−1.1 V), the source terminal of N5 goes to −1.1 V and the transistor N5 becomes conducting. In the same manner N6 becomes conductive and the source terminal of N6 goes to −1.1 V. Because the gate terminals of N5 and N6 are at 0 V, and because the source and drain terminals of N5 and N6 are at −1.1 V, the maximum voltage difference between any two terminals of N5 and N6 is 1.1 V, below the maximum stress limit. The gate terminals of the transistors P5, P6 both receive −1.8 V. Because the source terminal of the transistor P5 receives the negative body bias voltage $V_{BN}$ of −1.1 V, the transistor P5 becomes conductive. In the same manner the transistor P6 becomes conductive. Because gate terminals of P5, P6 both receive −1.8 V, and because the source and drain terminals of the transistors P5, P6 all receive −1.8 V, the next in voltage difference between any two terminals of the transistors P5, P6 is 0.7 V, below the maximum stress limit of the transistors P5, P6. The transistors N5, N6, P5, P6 of the first circuit branch 81 are conductive and the negative body bias voltage $V_{BN}$ is output on the output terminal Out of the multiplexer 24.

In FIG. 3B the second circuit path 81 is non-conductive so that the output terminal Out is shielded from positive body bias voltage $V_{BP}$. The transistors N7, P8 receive 0 V on their gate terminals. The transistor N8 receives −1.8 V on its gate terminal.

The transistor P7 receives 1.8 V on its gate terminal. Because the transistor N8 has a lower voltage on the gate terminal (−1.8 V) than on its source terminal (−1.1 V), the transistor N8 is nonconductive. Because the transistor P7 has a higher voltage on its gate terminal (1.8 V) than on its source terminal (1.1 V), the transistor P7 is nonconductive. With both P7 and N8 nonconductive, the second current branch 83 is nonconductive. The source terminal of the transistor N7 and the drain terminal of the transistor N8 are floating. The maximum voltage difference between any of the terminals of the transistor N8 is 0.7 V. The maximum voltage difference between any of the terminals of the transistor P8 is 1.1 V. The maximum voltage difference between any of the terminals of the transistor N7 is 1.1 V. The maximum voltage difference between any of the terminals of the transistor P7 is 0.7 V. Thus, all of the transistors in the second circuit branch are below the maximum stress level.

In FIG. 3B the third circuit path 85 is non-conductive so that the output terminal Out is shielded from default body bias voltage $V_{BA}$. The transistors N9, P10 receive 0 V on their gate terminals. The transistor N10 receives −1.8 V on its gate terminal.

The transistor P9 receives 1.8 V on its gate terminal. Because the transistor N10 has a lower voltage on the gate terminal (−1.8 V) than on its source terminal (−1.1 V), the transistor N10 is nonconductive. Because the transistor P9 has a higher voltage on its gate terminal (1.8 V) than on its source terminal (0 V), the transistor P9 is nonconductive. With both P9 and N10 nonconductive, the third current branch is nonconductive. The source terminal of the transistor N9 and the drain terminal of the transistor N10 are floating. The maximum voltage difference between any of the terminals of the transistor N10 is 0.7 V. The maximum voltage difference between any of the terminals of the transistor P10 is 1.1 V. The maximum voltage difference between any of the terminals of the transistor N9 is 0 V. The maximum voltage difference between any of the terminals of the transistor P9 is 1.8 V. Thus, all of the transistors in the third circuit branch are below the maximum stress level.

Figure 3C:
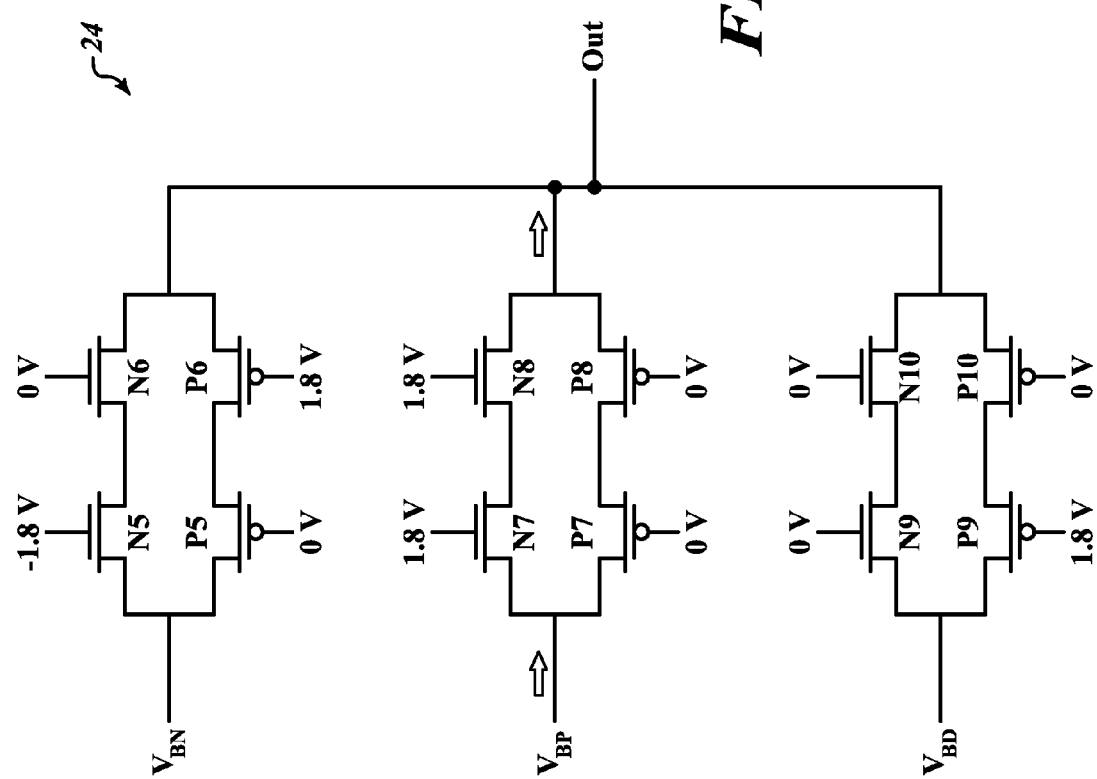

FIG. 3C illustrates an example in which the multiplexer 24 outputs the positive body bias voltage $V_{BP}$ at Out, the transistors N7, N8, P7, P8 of the second circuit branch 83 are all conductive. In this case, the gate terminals of the transistors N7, N8 receive 1.8 V. The gate terminals of the transistors P7, P8 receive 0 V. Because the gate terminal of the NMOS transistor N7 is at 1.8 V while the drain terminal of the transistor is at 1.1 V, the source terminal of the transistor N7 also goes to 1.1 V in the same manner, and the transistor N8 is also rendered conductive. Because the gate terminal of the P-channel transistor P7 receives 0 V while the source terminal of the transistor P7 receives 1.1 V, the P-channel transistor P7 is rendered conductive. In the same manner the P-channel transistor P8 is also rendered conductive. Thus, the positive body bias voltage $V_{BP}$ is passed through the second circuit branch to the output Out.

In FIG. 3C the first circuit branch 81 is non-conductive so that the output terminal Out is shielded from negative body bias voltage $V_{BN}$. The transistors N6, P5 receive 0 V on their gate terminals. The transistor N5 receives −1.8 V on its gate terminal. The transistor P6 receives 1.8 V on its gate terminal. Because the transistor N6 has a lower voltage on the gate terminal (0 V) than on its source terminal (1.1 V), the transistor N6 is nonconductive. Because the transistor P5 has a higher voltage on its gate terminal (0 V) than on its source terminal (−1.1 V), the transistor P5 is nonconductive. With both P5 and N6 nonconductive, the second current branch is nonconductive. The source terminal of the transistor N5 and the drain terminal of the transistor P6 are floating. The maximum voltage difference between any of the terminals of the transistor N6 is 1.1 V. The maximum voltage difference between any of the terminals of the transistor P6 is 0.7 V. The maximum voltage difference between any of the terminals of the transistor N5 is 0.7 V. The maximum voltage difference between any of the terminals of the transistor P7 is 1.1 V. Thus, all of the transistors in the first circuit branch 81 are below the maximum stress level.

In FIG. 3C the third circuit path 85 is non-conductive so that the output terminal Out is shielded from the default body bias voltage $V_{BD}$. The transistors N9, N10, P10 receive 0 V on their gate terminals. The transistor P9 receives 1.8 V on its gate terminal. Because the transistor N10 has a lower voltage on the gate terminal (0 V) than on its source terminal (1.1 V), the transistor N10 is nonconductive. Because the transistor P9 has a higher voltage on its gate terminal (1.8 V) than on its source terminal (0 V), the transistor P9 is nonconductive. With both P9 and N10 nonconductive, the third current branch is nonconductive. The maximum voltage difference between any of the terminals of the transistor N10 is 1.1 V. The maximum voltage difference between any of the terminals of the transistor P10 is 0.7 V. The maximum voltage difference between any of the terminals of the transistor N9 is 0 V. The maximum voltage difference between any of the terminals of the transistor P9 is 1.8 V. Thus, all of the transistors in the third circuit branch are below the maximum stress level.

In FIG. 3D the multiplexer 24 outputs the default bias voltage $V_{BD}$ (0 V) at Out, the transistors N9, N10, P9, P10 of the third circuit branch 95 are all conductive. In this case, the gate terminals of the transistors N9, N10 receive 1.8 V. The gate terminals of the transistors P9, P10 receive −1.8 V. Because the gate terminal of the n-channel transistor N9 is at 1.8 V while the drain terminal of the transistor is at 0 V, the transistor N9 is conductive and the source terminal of the transistor N9 also goes to 0 V. In the same manner, the transistor N10 is also rendered conductive. Because the gate terminal of the P-channel transistor P9 receives −1.8 V while the source terminal of the transistor P9 receives 0 V, the P-channel transistor P9 is rendered conductive. In the same manner the P-channel transistor P10 is also rendered conductive. Thus, the default body bias voltage $V_{BD}$ is passed through the third circuit branch to the output Out. Alternatively, the gate terminals of the transistors P9, P10 can receive 0 V, in which case the default body bias voltage is passed to Out only through the transistors N9, 10.

In FIG. 3D the first circuit branch 81 is non-conductive so that the output terminal Out is shielded from negative body bias voltage $V_{BN}$. The transistors N6, P5 receive 0 V on their gate terminals. The transistor N5 receives −1.8 V on its gate terminal. The transistor P6 receives 1.8 V on its gate terminal. Because the transistor N6 has the same voltage on its gate terminal (0 V) as on its source terminal (0 V), the transistor N6 is nonconductive. Because the transistor P5 has a higher voltage on its gate terminal (0 V) than on its source terminal (−1.1 V), the transistor P5 is nonconductive. With both P5 and N6 nonconductive, the second current branch is nonconductive. The maximum voltage difference between any of the terminals of the transistor N6 is 0 V. The maximum voltage difference between any of the terminals of the transistor P6 is 1.8 V. The maximum voltage difference between any of the terminals of the transistor N5 is 0.7 V. The maximum voltage difference between any of the terminals of the transistor P7 is 1.1 V. Thus, all of the transistors in the first circuit branch 81 are below the maximum stress level.

In FIG. 3D the second circuit branch 83 is non-conductive so that the output terminal Out is shielded from the positive body bias voltage $V_{BP}$. The transistors N7, P8 receive 0 V on their gate terminals. The transistor N8 receives −1.8 V on its gate terminal. The transistor P7 receives 1.8 V on its gate terminal. Because the transistor N8 has a lower voltage on the gate terminal (−1.8 V) than on its source terminal (0 V), the transistor N8 is nonconductive. Because the transistor P7 has a higher voltage on its gate terminal (1.8 V) than on its source terminal (1.1 V), the transistor P7 is nonconductive. With both P7 and N8 nonconductive, the second current branch 83 is nonconductive. The maximum voltage difference between any of the terminals of the transistor N8 is 1.8 V. The maximum voltage difference between any of the terminals of the transistor P8 0 V. The maximum voltage difference between any of the terminals of the transistor N7 is 1.1 V. The maximum voltage difference between any of the terminals of the transistor P7 is 0.7 V. Thus, all of the transistors in the second circuit branch 83 are below the maximum stress level. Alternatively, the gate terminal of the transistors N8 can receive 1.8 V.

There are also circumstances, for example during testing of the integrated circuit die 20, in which $V_{BD}$ will have a value other than ground. In the case in which $V_{BD}$ is higher than ground, including up to the value of $V_{BP}$, the voltages received by the transistors N5-N10, P5-P10 can be the same as for the case in which the default body bias voltage $V_{BD}$ is 0 V as shown in FIG. 3D, with following modifications: the gate terminal of N8 receives 1.8 V, and the gate terminals of P9, P10 receive 0 V. In the case in which $V_{BD}$ is less than ground, including down to the value of $V_{BN}$, the voltages on the gate terminals of the transistors N5-N10, P5-P10 can be as follows: N5, P6 receive −1.8 V. P5, N6 receive 0 V. N7, P8 receive 0 V. N8 receives −1.8 V, P7 receives 1.8 V. N9, N10 receive 0 V. P9, P10 receive −1.8 V.

In the examples disclosed above, all of the transistors, aside from N6, P8, which only receive ground voltage, can receive at least two different voltages on their gate terminals. The transistors N10, P9 can receive three different voltages on their gate terminals according to the various circumstances. In this way, the multiplexer 24 can pass the negative body bias voltage $V_{BN}$, the positive body bias voltage $V_{BP}$, and the default body bias $V_{BD}$ without surpassing the stress limits of the transistors N5-N10, P5-P10.

Those of skill in the art will recognize, in light of the present disclosure, that many other circuit structures and specific gate terminal voltage values can be used in accordance with principles of the present disclosure. All such other circuit structures and voltage values fall within the scope of the present disclosure.

Figure 4:
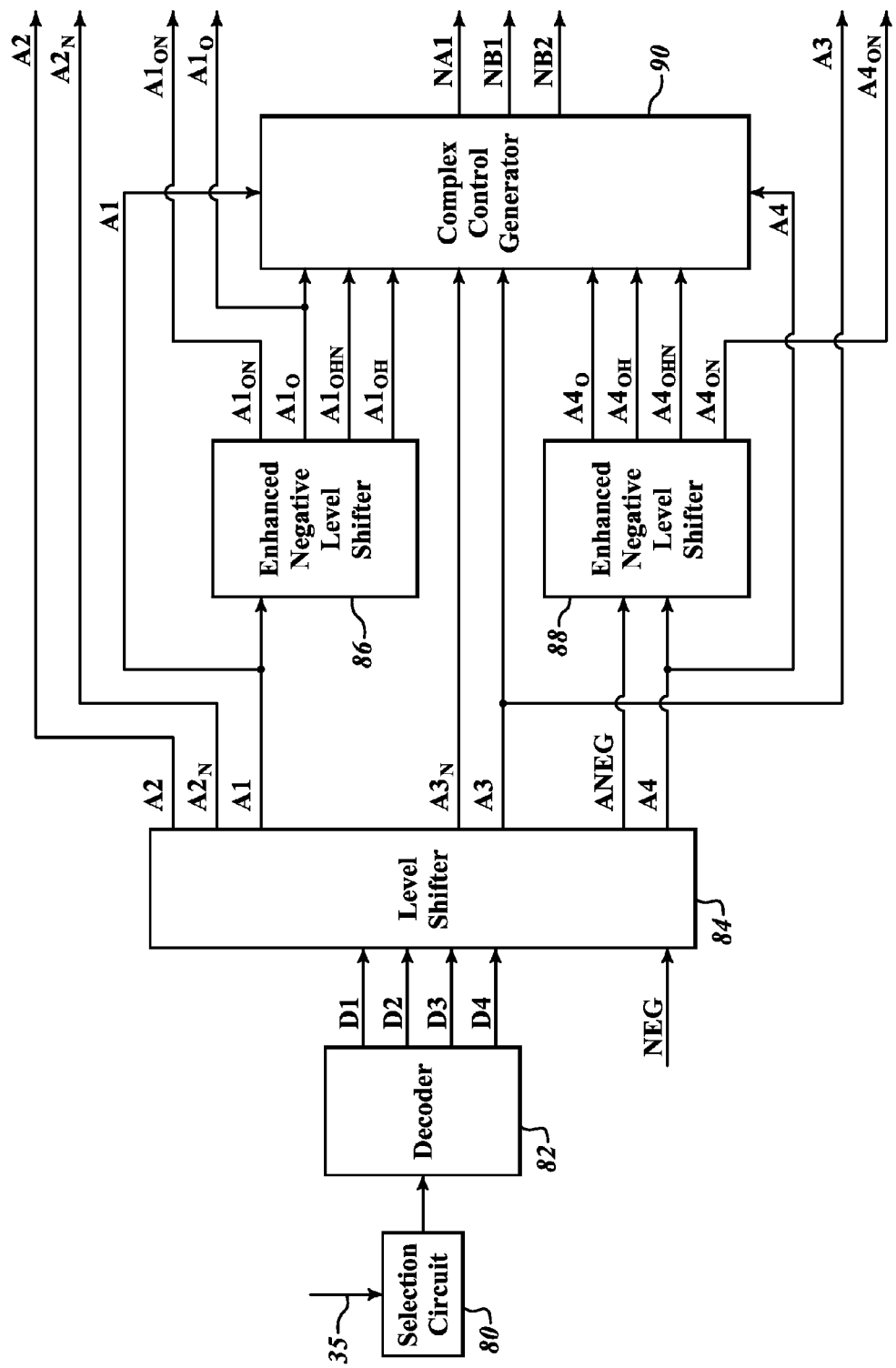
FIG. 4 is a schematic diagram of a control circuit according to one embodiment.

FIG. 4 is a block diagram of a control circuit 26, according to one embodiment. The control circuit 26 includes a selection circuit 80. The selection circuit 80 receives a temperature signal on line 35 from the temperature sensor 32 and outputs a selection signal based on the temperature signal value as explained previously with respect to FIG. 1. The selection signal is, for example, a two-bit digital signal on line 35 based on the temperate that selects which body bias voltage will be output from the multiplexer 24. A decoder 82 is coupled to the second circuit 80. The decoder 82 receives the supply voltages $V_{DD}$ and ground, as well as the selection signal from the selection circuit 80. The decoder 82 outputs four digital signals D1-D4 based on the value of the selection signal. For example, depending on the value of the selection signal, one of the digital signals D1-D4 will be a logical 1 ($V_{DD}$) while all others will be a logical 0 (ground). In particular, D1 is high when $V_{BN}$ is selected, D2 is high when $V_{BP}$ is selected, D3 is high when $V_{BD}$ is selected (in a case which $V_{BD}$ is equal to or greater than 0 V), and D4 is high when $V_{BD}$ is selected (in the case which $V_{BA}$ is less than 0 V). The decoder 82 outputs the digital signals D1-D4 to level shifter 84. The level shifter 84 receives supply voltages $V_{DD}$, ground, and a high voltage $V_H$ (1.8 V). The level shifter 84 receives the digital signals D1-D4 in the $V_{DD}$ voltage domain and outputs corresponding signals A1-A4 in the $V_H$ voltage domain. The level shifter 84 shifts whichever one of the digital signals is at a logical 1 to the high analog voltage $V_H$, while the digital signals that are at the logical value 0 remain at 0 V. In addition to A1-A4, the level shifter 84 outputs $A2_N$ and $A3_N$, which are the logical compliments of A2 and A3, respectively. The level shifter 84 outputs the signal A1 to the enhanced negative level shifter 86 and as an output of the control circuit 26. The level shifter outputs the signal A4 to an enhanced negative level shifter 88. The level shifter 84 outputs the signals A2, $A2_N$ as outputs of the control circuit 26. The level shifter 84 outputs, A3, $A3_N$ to the complex control generator 90. The level shifter 84 also outputs $A3_N$ as an output of the control circuit 26. The level shifter 84 also receives a digital control signal NEG which indicates whether the negative supply voltage $V_{HN}$ (−1.8 V) is present, because in some circumstances the body bias generator 22 may not be called on to generate the negative supply voltage, particularly in case when negative body bias voltage $V_{BN}$ is not needed. NEG is a logical 1 when the negative voltage supply $V_{HN}$ (−1.8 V) is not present and the corresponding supply port is driven to 0 V. NEG is a logical 0 when the negative voltage supply (−1.8 V) is present. The level shifter 84 converts NEG to ANEG, having a voltage of 1.8 V when NEG is a logical 1 and 0 V when NEG is a logical 0. The level shifter 84 outputs ANEG to the enhanced negative level shifters 86, 88, and to the complex control generator 90, though FIG. 4 only illustrates ANEG being output to the enhanced negative level shifter 88.

The enhanced negative level shifter 86 receives the signal A1 and outputs four signals $A1_O$, $A1_{ON}$, $A1_{OH}$, $A1_{OHN}$. If ANEG=0 V (indicating that −1.8 V is available on negative supply port), and A1=1.8 V (indicating that $V_{BN}$ has been selected to be output from the multiplexer 24), then the enhanced negative level shifter 86 will cause $A1_O$ to drop from 1.8 V to 0 V, $A1_{ON}$ will drop to −1.8 V, $A1_{OH}$ will remain at 1.8 V, and $A1_{OHN}$ will drop to −1.8 V. If A1=0 V, then $A1_O$=−1.8 V, $A1_{ON}$=0 V, $A1_{OH}$=−1.8 V, and $A1_{OHN}$=1.8 V.

For the case in which ANEG=1.8 V (indicating that 0 V is present on negative supply port), and A1=1.8 V, then $A1_O$=1.8 V, $A1_{ON}$=0 V, $A1_{OH}$=1.8 V, and $A1_{OHN}$=0 V. When ANEG=1.8 V and A1=0 V then $A1_O$=0 V, $A1_{ON}$=1.8 V, $A1_{OH}$=0 V, and $A1_{OHN}$=1.8 V.

The enhanced negative level shifter outputs $A1_O$, $A1_{OHN}$, and $A1_{OH}$ to the complex control generator 90. $A1_{ON}$ and $A1_O$ are also outputs of the control circuit 26.

The enhanced negative level shifter 88 receives the signal A4 and outputs four analog signals $A4_O$, $A4_{ON}$, $A4_{OH}$, $A4_{OHN}$. If ANEG=0 V (indicating that −1.8 V is available on the negative supply port), and A4=1.8 V (indicating that $V_{BD}$ has been selected to be output from the multiplexer 24 and that $V_{BD}$ is less than 0 V), then the enhanced negative level shifter 86 will cause $A4_O$ to drop from 1.8 V to 0 V, $A4_{ON}$ will drop to −1.8 V, $A4_{OH}$ will remain at 1.8 V, and $A4_{OHN}$ will drop to −1.8 V. If A4=0 V, then $A4_O$=0−1.8 V, $A4_{ON}$=0 V, $A4_{OH}$=−1.8 V, and $A4_{OHN}$=1.8 V.

For the case in which ANEG=1.8 V (indicating that 0 V is present on the negative supply port), and A4=1.8 V, then $A4_O$=1.8 V, $A4_{ON}$=0 V, $A4_{OH}$=1.8 V, and $A4_{OHN}$=0 V. When ANEG=1.8 V and A4=0 V then $A4_O$=0 V, $A4_{ON}$=1.8 V, $A4_{OH}$=0 V, and $A4_{OHN}$=1.8 V.

The enhanced negative level shifter 88 outputs $A4_O$, $A4O_{HN}$, and $A4_{OH}$ to the complex control generator 90. $A4_{ON}$ is an output of the control circuit 26. The complex control generator 90 receives $A1_O$, $A1_{OH}$, $A1_{OHN}$, $A4_{OH}$, $A4_O$, $A4_{OHN}$, ANEG, and the supply voltages GND, $V_H$, and $V_{HN}$. The complex control generator 90 outputs the control signals NB1, NA1, and NB2 to the multiplexer 24 based on the signals received by the complex control generator 90.

Figure 5:
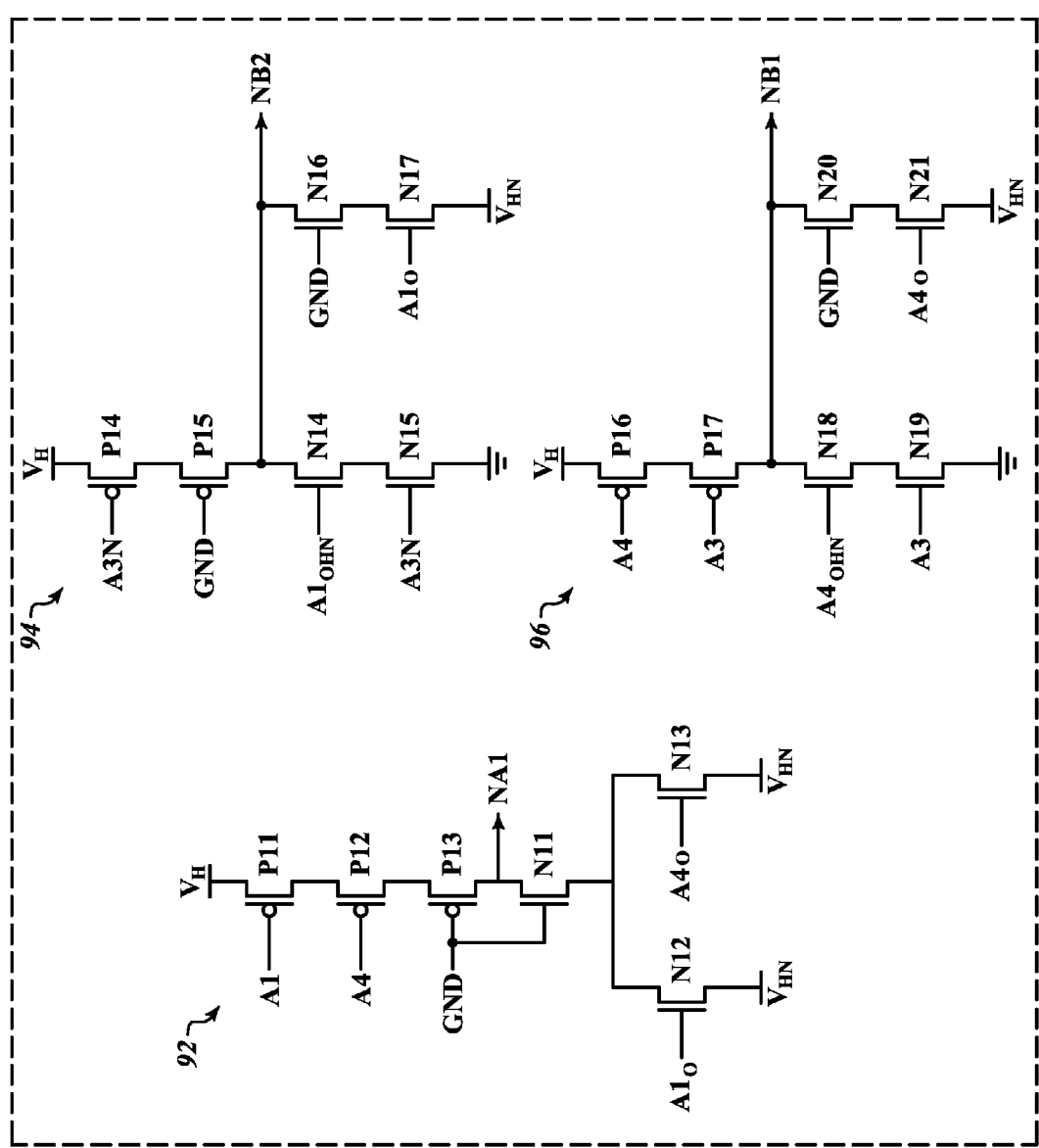
FIG. 5 is a schematic diagram of a complex control signal generator, according to one embodiment.

FIG. 5 is a schematic diagram of portions of the complex control generator 90 for generating the control signals NA1, NB1, and NB2. In particular, the complex control generator includes a circuit 92 for generating the control signal NA1, a circuit 94 for generating the control signal NB2, and a circuit 96 for generating the control signal NB1. The circuit 92 outputs either $V_{HN}$ (−1.8 V or 0 V whichever the case may be) or $V_H$ (1.8 V). In particular, if A1, A4 are both 0 V, then NA1=$V_H$. If either A1 or A4 is 1.8 V, then NA1=−1.8 V ($V_{HN}$), except in the case where the high negative voltage is not present, in which case $V_{HN}$ is 0 V.

The circuit 94 receives supply voltages $V_H$ (1.8 V), $V_{HN}$ (−1.8 V), and ground (0 V). The output NB2 can therefore be either 1.8 V, −1.8 V, or 0 V depending on the values of the control signals $A1_{OHN}$, $A3_N$, and $A1_O$. The output NB2 can therefore be either 1.8 V, −1.8 V, or 0 V depending on the values of the control signals A4, A3, $A4_{OHN}$, and $A4_O$.

The circuit 96 receives the control signals $V_H$ (1.8 V), $V_{HN}$ (−1.8 V or 0 V whichever the case may be), and ground (0 V). The output NB1 can therefore be either 1.8 V, −1.8 V, or 0 V depending on the values of the control signals $A4_{OHN}$, A3, $A4_O$, and $A1_O$. The output NB1 can therefore be either 1.8 V, −1.8 V, or 0 V depending on the values of the control signals A4, A3, $A4_{OHN}$, and $A4_O$.

Figure 6:
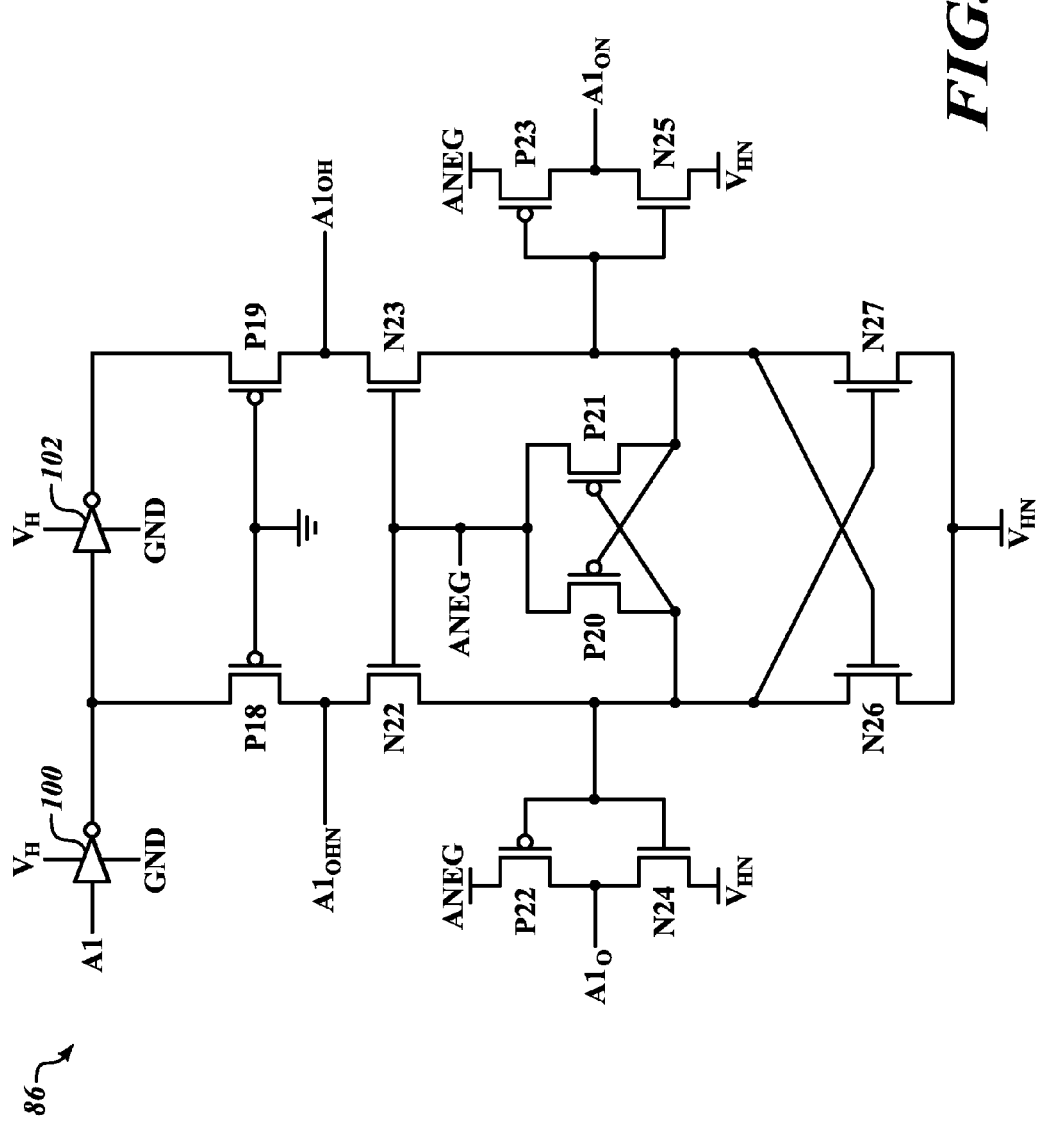
FIG. 6 is a schematic diagram of an enhanced negative level shifter, according to an embodiment.

FIG. 6 is a schematic diagram of the enhanced negative level shifter 86. The enhanced negative level shifter 86 receives the signal A1 at the input of the inverter 92. The inverter 92 is powered by the high supply voltage $V_H$ and ground. If ANEG=0 V (indicating that −1.8 V is available on $V_{HN}$), and A1=1.8 V (indicating that $V_{BN}$ has been selected to be output from the multiplexer 24), then the enhanced negative level shifter 86 will cause $A1_O$ to drop from 1.8 V to 0 V, $A1_{ON}$ will drop to −1.8 V, $A1_{OH}$ will remain at 1.8 V, and $A1_{OHN}$ will drop to −1.8 V. If A1=0 V, then $A1_O$=0−1.8 V, $A1_{ON}$=0 V, $A1_{OH}$=−1.8 V, and $A1_{OHN}$=1.8 V.

For the case in which ANEG=1.8 V (indicating that 0 V is present at $V_{HN}$), and A1=1.8 V, then $A1_O$=1.8 V, $A1_{ON}$=0 V, $A1_{OH}$=1.8 V, and $A1_{OHN}$=0 V. When ANEG=1.8 V and A1=0 V, then $A1_O$=0 V, $A1_{ON}$=1.8 V, $A1_{OH}$=0 V, and $A1_{OHN}$=1.8 V.

The level shifter 88 operates in a similar manner, except that A4 is the input of the level shifter 88 and $A4_O$, $A4_{ON}$, $A4_{ON}$, and $A4_{OHN}$ are the outputs.

FIG. 7 is a schematic diagram of the multiplexer 104 according to one embodiment. The multiplexer 104 includes inputs of the negative body bias voltage $V_{BN}$, the positive body bias voltage $V_{BP}$, and the default body bias voltage $V_{BD}$. The multiplexer 104 outputs in one of these body bias voltages on the output Out. The multiplexer 104 includes circuit branches 106, 108, and 110 which respectively couple VBN, VBP, and VBD to the output Out. The multiplexer 104 is different from the multiplexer 24 in that each of the circuit branches 104, 108, and 110 includes more than two pairs of NMOS and PMOS transistors. This is to illustrate that each circuit branch can include more than two pairs of transistors, for example three or more pairs of NMOS and PMOS transistors. Those of skill in the art will appreciate that many variations can be implemented, in light of the present disclosure, to provide a multiplexer that safely outputs positive, a negative, and the ground body bias voltage. All such other configurations fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit die comprising:
   a semiconductor substrate;
   a doped well in the semiconductor substrate;
   a plurality of transistors including at least one PMOS transistor and at least one NMOS transistor having body regions positioned in the doped well;
   a temperature sensor that outputs a temperature signal indicative of a temperature of the semiconductor substrate;
   a body bias generator that outputs a positive body bias voltage, a negative body bias voltage, and a ground body bias voltage; and
   a bias output multiplexer that receives the positive body bias voltage, the negative body bias voltage, and the ground body bias voltage and selectively applies one of the positive body bias voltage, the negative body bias voltage, or the ground body bias voltage to the doped well based at least in part on the temperature signal.

2. The integrated circuit die of claim 1 comprising a control circuit configured to output one or more control signals to the bias output multiplexer.

3. The integrated circuit die of claim 2 wherein the temperature sensor is configured to output the temperature signal to the control circuit.

4. The integrated circuit die of claim 3 wherein the control circuit generates the one or more control signals based in part on the temperature signal.

5. The integrated circuit die of claim 4 wherein the doped well is a P well.

6. The integrated circuit die of claim 5 wherein the control circuit causes the bias output multiplexer to output the negative body bias if the temperature of the semiconductor substrate is above a high threshold temperature.

7. The integrated circuit die of claim 6 wherein the control circuit causes the bias output multiplexer to output the positive body bias if the temperature of the semiconductor substrate is below a low threshold temperature.

8. The integrated circuit die of claim 7 wherein the control circuit causes the bias output multiplexer to output the ground body bias voltage if the temperature of the semiconductor substrate is between the high and the low threshold temperatures.

9. The integrated circuit die of claim 2 wherein the bias output multiplexer includes:
   a first input configured to receive the negative body bias voltage;
   a second input configured to receive the positive body bias voltage;
   a third input configured to receive the ground body bias voltage; and
   an output configured to selectively output the negative, positive, or ground body bias voltage based on the one or more control signals.

10. The integrated circuit die of claim 9 wherein the bias output multiplexer includes:
    a first circuit branch coupled between the first input and the output, the first circuit branch including:
      a first and a second NMOS transistor coupled together in series between the first input and the output; and
      a first and a second PMOS transistor coupled together in series between the first input and the output, the first and second PMOS transistors coupled in parallel with the first and second NMOS transistors;
    a second circuit branch coupled between the second input and the output, the second circuit branch including:
      a third and a fourth NMOS transistor coupled together in series between the second input and the output; and
      a third and a fourth PMOS transistor coupled together in series between the second input and the output, the third and fourth PMOS transistors coupled in parallel with the third and fourth NMOS transistors; and
    a third circuit branch coupled between the third input and the output, the third circuit branch including:
      a fifth and a sixth NMOS transistor coupled together in series between the third input and the output; and
      a fifth and a sixth PMOS transistor coupled together in series between the third input and the output, the fifth and sixth PMOS transistors coupled in parallel with the fifth and sixth NMOS transistors.

11. The integrated circuit die of claim 1 wherein the semiconductor substrate is an FDSOI substrate.

12. The integrated circuit die of claim 1 wherein the integrated circuit die includes an SRAM array.

13. An integrated circuit die comprising:
    a semiconductor substrate;
    a doped well region in the semiconductor substrate;
    a plurality of transistors having body regions positioned in the doped well region;
    a temperature sensor that outputs a temperature signal indicative of a temperature of the semiconductor substrate;
    a body bias generator that outputs a positive body bias voltage, a negative body bias voltage, and a ground body bias voltage;
    a bias output multiplexer that receives the positive body bias voltage, the negative body bias voltage, and the ground body bias voltage and selectively applies, at an output of the bias output multiplexer, one of the positive body bias voltage, the negative body bias voltage, or the ground body bias voltage to the doped well region based at least in part on the temperature signal, the bias output multiplexer including:
      a first circuit branch coupled between a first input that is configured to receive the negative body bias voltage and the output, the first circuit branch including:
        first and second NMOS transistors coupled together in series between the first input and the output, and
        first and second PMOS transistors coupled together in series between the first input and the output, the first and second PMOS transistors coupled in parallel with the first and second NMOS transistors;
      a second circuit branch coupled between a second input that is configured to receive the positive body bias voltage and the output, the second circuit branch including:

third and fourth NMOS transistors coupled together in series between the second input and the output, and third and fourth PMOS transistors coupled together in series between the second input and the output, the third and fourth PMOS transistors coupled in parallel with the third and fourth NMOS transistors; and a third circuit branch coupled between a third input that is configured to receive the ground body bias voltage and the output, the third circuit branch including:

fifth and sixth NMOS transistors coupled together in series between the third input and the output, and fifth and sixth PMOS transistors coupled together in series between the third input and the output, the fifth and sixth PMOS transistors coupled in parallel with the fifth and sixth NMOS transistors; and a control circuit configured to output one or more control signals to the bias output multiplexer, wherein the PMOS and NMOS transistors each receive one of the control signals on respective gate terminals, the control signals collectively selecting the positive, negative or ground body bias voltage to be passed to the output.

14. The integrated circuit die of claim 13 wherein one or more of the PMOS and NMOS transistors of the multiplexer receives on the respective gate terminal a negative control signal, a positive control signal, or a ground control signal.

15. A device comprising:
a semiconductor substrate including a doped well;
a plurality of transistors having body portions in the doped well, the plurality of transistors including at least one PMOS transistor and at least one NMOS transistor; and
a body bias multiplexer configured to receive a positive body bias voltage, a negative body bias voltage, and an intermediate body bias voltage and to selectively apply the positive, negative, or intermediate body bias voltage to the doped well.

16. The device of claim 15 wherein the body bias multiplexer includes a control transistor configured to receive at a gate terminal at least one of a positive control signal having a positive voltage polarity, a negative control signal having a negative voltage polarity, and an intermediate control signal having a voltage between the positive and negative control signals, the body bias multiplexer being configured to selectively output the positive, negative or intermediate body bias voltage based in part on which of the positive, negative, or intermediate control signals is received at the gate terminal of the control transistor.

17. The device of claim 15 wherein the body bias multiplexer includes:
a first input configured to receive the negative body bias voltage;
a second input configured to receive the positive body bias voltage;
a third input configured to receive the intermediate body bias voltage, the intermediate body bias voltage having a voltage level that is between the negative and positive body bias voltages;
an output configured to selectively output the negative, positive, or intermediate body bias voltage; and
respective circuit branches each coupled between a respective input and the output of the multiplexer, each circuit branch respectively including:
at least two NMOS transistors coupled in series between the respective input and the output; and
at least two PMOS transistors coupled in series between the respective input and the output and in parallel with the at least two NMOS transistors.

18. A method comprising:
receiving at a body bias multiplexer a positive body bias voltage, a negative body bias voltage, and an intermediate body bias voltage;
receiving at the body bias multiplexer one or more control signals from a control circuit; and
biasing at least one PMOS transistor and at least one NMOS transistor, having body portions in a doped well of a semiconductor substrate, by selectively outputting one of the positive, negative, or intermediate voltage from the body bias multiplexer to the doped well.

19. The method of claim 18 comprising selectively passing the positive body bias voltage from a first input of the body bias multiplexer to an output of the body bias multiplexer through a circuit branch including a group of at least two NMOS control transistors coupled together in series between the first input and the output and through a group of at least two control PMOS transistors coupled together in series between the first input and the output, the group of at least two control PMOS transistor being in parallel with the group of at least two control NMOS transistors.

20. The method of claim 18 comprising:
receiving a temperature signal indicative of a temperature of the semiconductor substrate; and
selectively outputting one of the positive body bias voltage, the negative body bias voltage or the intermediate body bias voltage based on the temperature of the semiconductor substrate as indicated by the temperature signal.

* * * * *